(12) United States Patent
Furukawa et al.

(10) Patent No.: US 6,411,012 B2
(45) Date of Patent: Jun. 25, 2002

(54) MULTILAYER PIEZOELECTRIC ELEMENT AND METHOD OF PRODUCING THE SAME

(75) Inventors: Masahito Furukawa; Kenji Horino; Makoto Morita; Syuuzi Itoh; Minami Kudoh, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/730,596

(22) Filed: Dec. 7, 2000

(30) Foreign Application Priority Data

Dec. 8, 1999 (JP) .......................................... 11-348732
Jan. 17, 2000 (JP) ........................................ 2000-007904

(51) Int. Cl.[7] .............................................. H01L 41/08
(52) U.S. Cl. ...................................................... 310/328
(58) Field of Search ................................. 310/328, 366, 310/340, 344

(56) References Cited

U.S. PATENT DOCUMENTS 5,208,506 A * 5/1993 Yamashita ................... 310/328
6,207,069 B1 3/2001 Furukawa et al. .... 252/62.9 PZ

FOREIGN PATENT DOCUMENTS

| JP | 61-015382 | | 1/1986 | ........... H01L/41/08 |
|---|---|---|---|---|
| JP | 64-007575 A | * | 1/1989 | ................. 310/328 |
| JP | 5-299719 | | 11/1993 | ........... H01L/41/24 |
| JP | 7-7193 A | * | 1/1995 | ................. 310/328 |
| JP | 7-007193 | | 1/1995 | ........... H01L/41/22 |
| JP | 7-176802 | | 7/1995 | ......... H01L/41/083 |
| JP | 7-240545 | | 9/1995 | ......... H01L/41/083 |
| JP | 8-32131 A | * | 2/1996 | ................. 310/328 |
| JP | 9-260736 | | 10/1997 | ......... H01L/41/083 |
| JP | 10-136665 | | 5/1998 | ........... H02N/2/00 |

* cited by examiner

*Primary Examiner*—Thomas M. Dougherty
(74) *Attorney, Agent, or Firm*—Oblon, Spivak, McClelland, Maier & Neustadt, P.C.

(57) ABSTRACT

An electronic part comprises a main part, a terminal electrode, and a film. The main part includes a sintered piezoelectric ceramic element, wherein a plurality of internal electrode layers and piezoelectric layers are alternately stacked. The terminal electrode is provided at an edge of the sintered piezoelectric ceramic element and electrically conducting to the internal electrodes. The film is provided on a surface of the sintered piezoelectric ceramic element and the exposed internal electrodes, and is made of a glass insulating material.

11 Claims, 9 Drawing Sheets

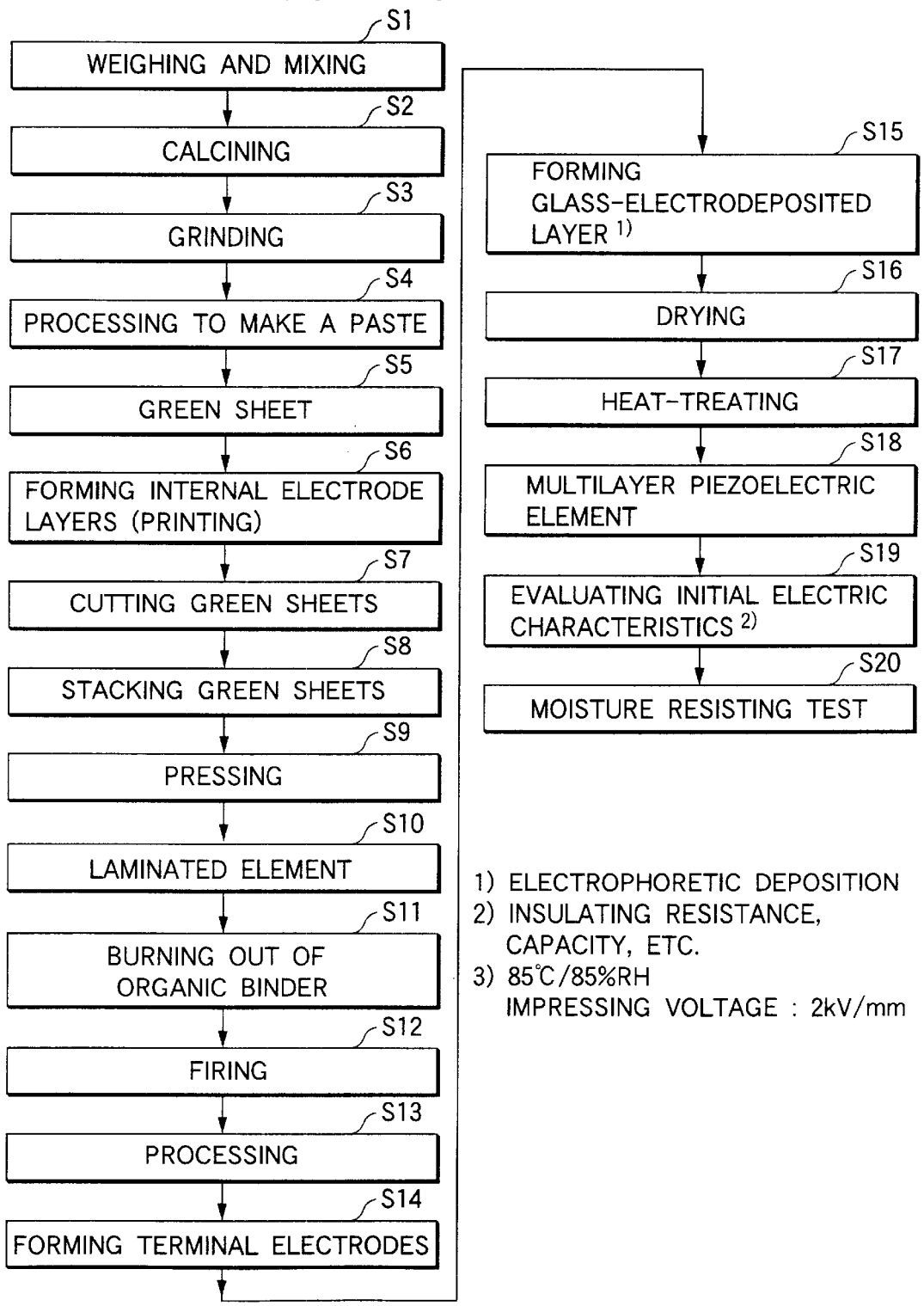
FIG.7 FLOW CHART OF MANUFACTURING PROCESSES AND TESTS FOR TEST SAMPLE
1) ELECTROPHORETIC DEPOSITION
2) INSULATING RESISTANCE, CAPACITY, ETC.
3) 85°C/85%RH
   IMPRESSING VOLTAGE : 2kV/mm

MULTILAYER PIEZOELECTRIC ELEMENT AND METHOD OF PRODUCING THE SAME

BACKGROUND OF THE INVENTION

1. Field of the Invention

The present invention relates to a multilayer piezoelectric element and a method of producing the same, in particular a method of producing such multilayer piezoelectric ceramics where reliability has been improved.

2. Description of the Related Art

In general, electronic parts of multilayer piezoelectric ceramic are composed by making stacked piezoelectric ceramic made by alternately stacking a plurality of layers of piezoelectric ceramic green sheets printed with internal electrodes of silver (Ag) or silver-palladium (Ag—Pd) alloy, firing the stacked piezoelectric ceramic, and coating, as shown in FIG. 11, an electrically conductive paste of silver being a main component to the sintered stacked ceramic 101 at edges thereof so as to form terminal electrodes 102a, 102b, 102c.

In addition, as shown in FIG. 12, there is also a product exposing internal electrodes 104 alternately stacked with piezoelectric ceramic layers 103 at sides of the sintered piezoelectric ceramic 101.

Electronic parts of the above multilayer piezoelectric ceramic are probable to generate a lot of minute pores within layers of sintered piezoelectric ceramic by firing, so that moisture goes into the pores by using for a long period of time under atmosphere at high temperature and high humidity, thereby to create defects in insulation between internal electrodes.

As a measure therefor, as shown in FIG. 13, external films 105 of an organic resin are formed on surfaces of the sintered piezoelectric ceramic 1 for preventing invasion or penetration of the moisture. However, it is difficult to perfectly avoid the invasion of the moisture with the external films 105 of the organic resin, and an insulating property goes down by such as migration of silver as an electrode material accompanying with use for a long time, inevitably resulting in short circuiting.

In a case where the multilayer piezoelectric element is miniaturized or complicated in configuration, the multilayer piezoelectric element sometimes exposes at its sides the edges of the internal electrode layers. If voltage is impressed to the internal electrode layers to drive the multilayer piezoelectric element under a condition where moisture is able to penetrate the edges, a metal composing the internal electrode layers is ionized and induces a so-called migration phenomena where the metal moves between electrodes in response to an electrical field. For the internal electrode layer, because of saving costs, alloys of silver being a main component, for example, Ag—Pd alloy are used in general. However, in the internal electrode layer comprising the alloy including Ag, migration easily occurs, and in extreme cases, metal bridges comprising Ag and the like are formed between opposite internal electrode layers. As a result, electrical short circuits are often caused between the opposite internal electrode layers by the metal bridges, probably missing reliability.

The migration is accelerated particularly under high temperature, high humidity or high electrical field. Then, improvement of moisture resistance has been designed by the under various measures.

(1) A method of coating an outer face of the multilayer piezoelectric element with an insulating material of a resin film or a glass insulating layer.

(2) A method of coating the outer face of the multilayer piezoelectric element with an insulating material of silicon oxide ($SiO_2$)

For example, JP-A-61-15382 discloses a technology which uniformly forms the silica insulating material on the exposed parts of the internal electrode layers through a decompression CVD method.

(3) A method of forming a glass insulating layer on the outer face of the multilayer piezoelectric element by a dry or wet transcribing method.

For example, JP-A-7-7193 discloses a technology which forms the glass insulating paste on a dry transcribing paper or a wet transcribing paper, delaminates, then sticks the glass insulating paste to four sides of the multilayer piezoelectric element, and heats it for coating the glass insulating material.

(4) A still further method of selectively coating the insulating material of inorganic material or high polymer material on only parts exposing the internal electrode layer of the multilayer piezoelectric element.

For example, JP-A-7-176802 discloses a technology which selectively adheres particles of inorganic materials as piezoelectric ceramic or high polymer such as polyimide onto only parts exposing the internal electrode layer of the multilayer piezoelectric element by the electrophoretic deposition so as to form the coating thereon.

(5) In the structure formed with holes in the multilayer piezoelectric element where the holes are filled with fillers, the coating is formed to the part exposing the edge of the internal electrode layer inside of the holes.

For example, JP-A-10-136665 discloses a structure formed with holes in the multilayer piezoelectric element where the holes are filled with soft fillers as silicone resin or urethane resin, and the coating is formed to the part exposing the edge of the internal electrode layer of the holes, thereby to improve the moisture resistance.

However, although depending on the above measures, the reliability of the multilayer piezoelectric element is not yet perfectly improved in view of the points mentioned below.

According to the above measure (1), if the multilayer piezoelectric element is coated on its outer face with a resin film, an effect of imparting the moisture resistance is poor, and a problem is left in there liability. In case the multilayer piezoelectric element is coated on its outer face with the glass insulating layer by an ordinary method, the moisture resistance is improved, but if elastic modulus is large different between the glass insulating layer and the piezoelectric ceramic when the multilayer piezoelectric element is driven, the glass insulating layer probably hampers displacement of the piezoelectric ceramic.

According to the above measure (2), the moisture resistance is improved, but when the multilayer piezoelectric element is driven so that tensile stress repeatedly acts on a silica film, the silica film is easily cracked. When cracking appears in the silica film, there is involved a problem that the edge of the internal electrode layer is again exposed, resulting to spoil the reliability.

For forming the silica film in a predetermined film thickness, a relatively long processing time lead to increase of the cost.

According to the above measure (3), if the outer face of the multilayer piezoelectric element is coated with the glass insulating layer, the moisture resistance is heightened, and appearing rate of defects is reduced when using it at the high humidity, but when, similarly to the measure (1), the elastic modulus is large different between the glass insulating layer and the piezoelectric ceramic, the glass insulating layer probably hampers displacement of the piezoelectric ceramic.

According to the measure (4), the moisture resistance is increased, and since the insulating material is selectively coated to only the part exposing the internal electrode layer, when the multilayer piezoelectric element is driven and the tensile stress is repeatedly acted on the inorganic coating layer, appearance of cracks can be checked. The reliability is therefore largely increased. Further, according to the electrophoretic deposition, comparing with the measure (2), the coating time of the insulating material is shortened, enabling to suppress increase of the cost more.

However, since the insulating material is formed to only parts exposing the internal electrode layers, the moisture resistance of the piezoelectric ceramic layer is not enough at parts not formed with the insulating material, for example, between the internal electrode layers, and in particular when pores exist in the piezoelectric ceramic layer, probability of spoiling the reliability is present.

According to the measure (5), the moisture resistance is improved in the part exposed at the holes, but at parts exposing the internal electrode layers outside, another coating layer should be separately provided.

SUMMARY OF THE INVENTION

In view of the above-mentioned problems, it is an object of the invention to offer electronic parts of the multilayer piezoelectric ceramic enabling to compose as scarcely causing deterioration of insulation resistance in spite of using for longer time under atmosphere at high temperature and at high humidity as well as a production method thereof.

It is another object of the invention to offer electronic parts of the multilayer piezoelectric ceramic maintaining a displacing characteristic well conditioned and enabling to compose as scarcely causing deterioration of insulation resistance as well as a production method thereof.

Further, it is an object of the invention to offer a method of producing a multilayer piezoelectric element having excellent reliability by uniformly forming the glass insulating layer at side parts exposing edges of the internal electrode layers of the multilayer piezoelectric element suppressing defects, and products thereof.

Herein, a term of "glass insulating layer" is defined by a coated layer comprising an amorphous inorganic compound and completely checking defects for preventing penetration of moisture.

In the electronic parts of the multilayer piezoelectric ceramic according to a first aspect of the invention, the sintered piezoelectric ceramic comprising a plurality of alternately stacked layers of internal electrodes and piezoelectric layers is a main part, provided at edges thereof with terminal electrodes conducting electricity to the internal electrodes, and is provided on surfaces thereof with films of glass insulating material.

In the electronic parts of the multilayer piezoelectric ceramic according to a second aspect of the invention, the sintered piezoelectric ceramic is provided on the surfaces thereof with films of the glass insulating material comprising any two or more components of ceramic compounds selected from elements composing all or a part of lead oxide (PbO), silicon oxide ($SiO_2$), aluminum oxide ($Al_2O_3$) and the sintered piezoelectric ceramic.

In the electronic parts of the multilayer piezoelectric ceramic according to a third aspect of the invention, the sintered piezoelectric ceramic is provided on the surfaces thereof with the film of the glass insulating material having thickness of 0.5 to 7.0 μm.

In the method of producing electronic parts of the multilayer piezoelectric ceramic according to a fourth aspect of the invention, the method comprises mixing piezoelectric ceramic powder in a binder solution so as to make slurry, making piezoelectric ceramic green sheets from the slurry, making a multilayer piezoelectric ceramic by alternately stacking a plurality of layers of the piezoelectric ceramic green sheets and internal electrodes, sintering the multilayer piezoelectric ceramic layers, followed by forming at edges of the sintered ceramic terminal electrodes electrically conducting to internal electrodes of the sintered piezoelectric ceramic, sintering the multilayer piezoelectric ceramics, followed by coating glass insulating paste on the surfaces of the sintered piezoelectric ceramic, and heat-treating the paste for making films with the glass insulating material.

In the method of producing electronic parts of the multilayer piezoelectric ceramic according to a fifth aspect of the invention, the sintered piezoelectric ceramic is coated on the surfaces thereof with the glass insulating paste comprising any two or more components of ceramic compounds selected from elements composing all or a part of lead oxide (PbO), silicon oxide ($SiO_2$), aluminum oxide ($Al_2O_3$) and the sintered piezoelectric ceramics.

In the method of producing electronic parts of the multilayer piezoelectric ceramic according to a sixth aspect of the invention, the sintered piezoelectric ceramic is coated on the surfaces thereof with the film of the glass insulating material in thickness of 0.5 to 7.0 μm.

Further, inventors have found the following constitution for accomplishing the above object so as to solve the problems.

In a method of producing a multilayer piezoelectric element which has a structure having an arrangement of a plurality of alternate stacking layers of piezoelectric ceramic layers and internal electrode layers and exposing the edges of the internal electrode layers, a seventh aspect of the invention comprises the steps of electrodepositing particles comprising a glass insulating material to the exposed sides through an electrophoretic deposition; and then carrying out a heat treatment at a predetermined temperature, thereby forming the glass insulating layer of the glass insulating material to the exposed parts only or both of the exposed parts and the surface of the piezoelectric layers of the internal electrode layers.

A eighth aspect of the invention is preferable in that the glass insulating layer has a thickness of 0.3 to 10 μm in the seventh aspect.

A ninth aspect of the invention is preferable in that, in the seventh or eighth aspect, the heat-treating temperature of the glass insulating layer is lower than a firing temperature of the multilayer piezoelectric element, and the glass insulating layer is composed of any one selected from the components of the glass component which is a single one, the glass component which is a plurality of mixed substances, the single component which is dispersed with piezoelectric ceramic in the glass matrix thereof, and the plurality of mixed component which is dispersed with the piezoelectric ceramic in the glass matrix thereof.

The softening points of these glass insulating materials are preferably 500 to 900° C.

A tenth aspect of the invention is convenient in that, in the ninth aspect, when the piezoelectric ceramic is contained in the glass insulating layer, this piezoelectric ceramic is the same as the piezoelectric ceramic composing the multilayer piezoelectric element.

An eleventh aspect of the invention is structured such that, in any one of the seventh to the ninth aspects, the glass insulating layer may contain PbO: 10 to 80 wt %, $SiO_2$: 10 to 80 wt %, $Al_2O_3$: 0 to 50 wt %, and one of the same piezoelectric ceramic as the piezoelectric ceramic of the multilayer piezoelectric element: 0 to 50 wt %.

A twelfth aspect of the invention is that the multilayer piezoelectric element as set forth in the seventh to eleventh aspects may be for a piezoelectric actuator.

A thirteenth aspect of the invention is the multilayer piezoelectric element produced by the seventh to eleventh aspects.

BRIEF DESCRIPTION OF THE DRAWINGS

FIG. 7 is a flow chart showing a procedure for processing the multilayer piezoelectric element according to the invention;

DETAILED DESCRIPTION OF THE PREFERRED EMBODIMENTS

Hereinafter, a first embodiment of the invention is described with reference to FIGS. 1 to 4. The shown electronic parts of the multilayer piezoelectric ceramic are, as shown in FIG. 1, composed of the sintered multilayer ceramic produced by drawing out from the electrically conductive paste of Ag or Ag—Pd alloy, printed to form the internal electrodes 110, 111, 112 with differently positioned electrodes within the surfaces of the piezoelectric ceramic green sheets 113, alternately stacking a plurality of layers of the piezoelectric ceramic green sheets 113 and the internal electrodes 110, 111, 112 to produce multilayer piezoelectric ceramics, and firing the multilayer piezoelectric ceramic.

Figure 12:
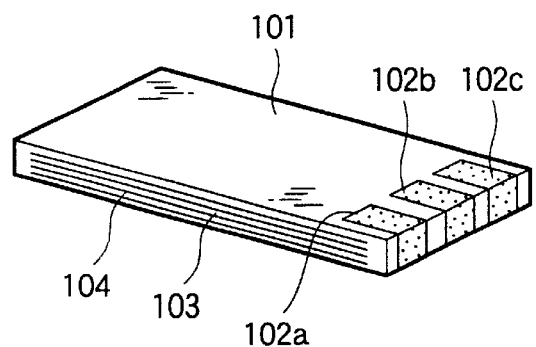
FIG. 12 is a perspective view showing the electronic parts of the multilayer piezoelectric ceramic exposing the internal electrodes according to the conventional example.
Figure 13:
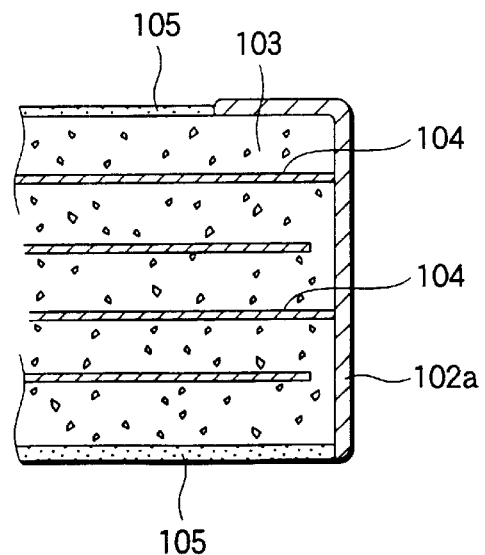
FIG. 13 is a cross sectional view showing electronic parts of the multilayer piezoelectric ceramic provided with films of the insulating resin according to the conventional example.

In the sintered multilayer ceramics, the electrically conductive paste of Ag being the main component is coated to the sintered multilayer ceramic 101 at edges thereof to form the terminal electrodes 114 which electrically conduct to the internal electrodes 110, 111, 112. The terminal electrodes 114 are formed as shown in 102a, 102b and 102c of FIG. 12. Further, the sintered piezoelectric ceramic is coated on the surfaces thereof with films 115 of the glass insulating material comprising any two or more components of ceramic compounds selected from elements composing all or a part of lead oxide (PbO), silicon oxide ($SiO_2$), aluminum oxide ($Al_2O_3$) and the sintered piezoelectric ceramic.

In the thus composed electronic parts of the multilayer piezoelectric ceramic, the surfaces of the sintered piezoelectric ceramic are protected with the films 115 of the non-permeable fine glass insulating material of moisture, so that it is possible to avoid defects of insulation between the internal electrodes and defects of insulation by migration, to work for a longer time under such atmosphere at high temperature and high humidity, and to secure the displacement amount, thereby enabling to compose products of high reliability and durability.

Figure 1:
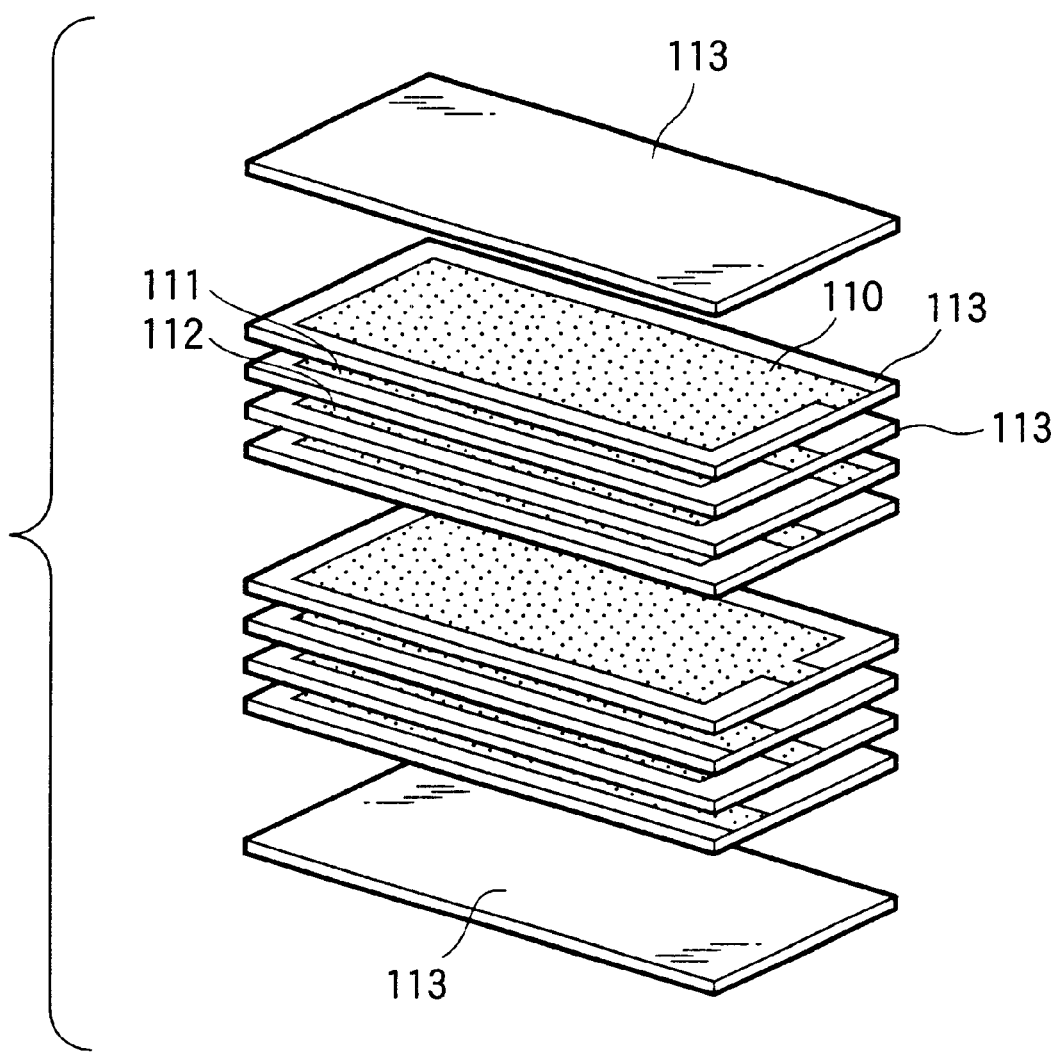
FIG. 1 is a perspective view showing internal electrodes composing the electronic parts of the multilayer piezoelectric ceramic not exposing the internal electrodes according to the invention and ceramic green sheets.
Figure 2:
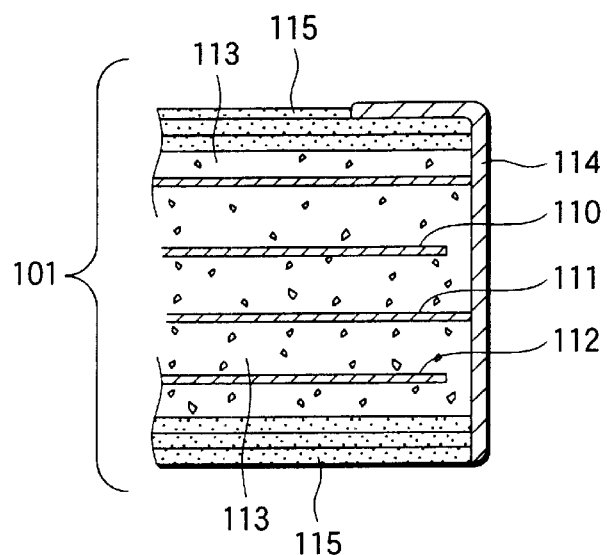
FIG. 2 is a cross sectional view showing the electronic parts of the multilayer piezoelectric ceramic according to those of FIG. 1.
Figure 3:
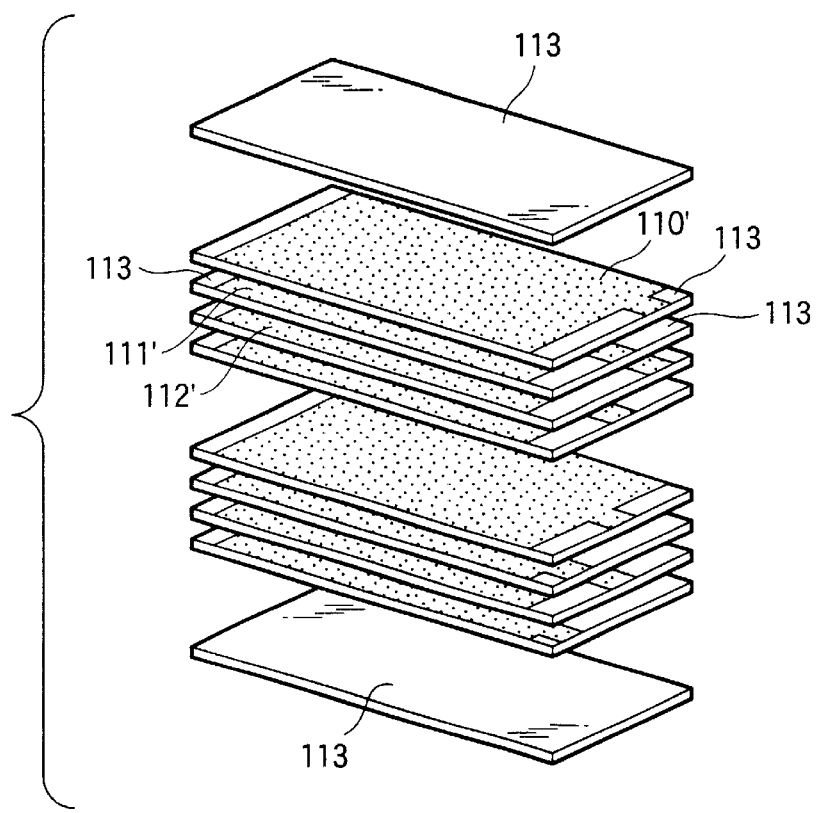
FIG. 3 is a perspective view showing internal electrodes composing the electronic parts of the multilayer piezoelectric ceramic exposing the internal electrodes according to the invention and ceramic green sheets.
Figure 4:
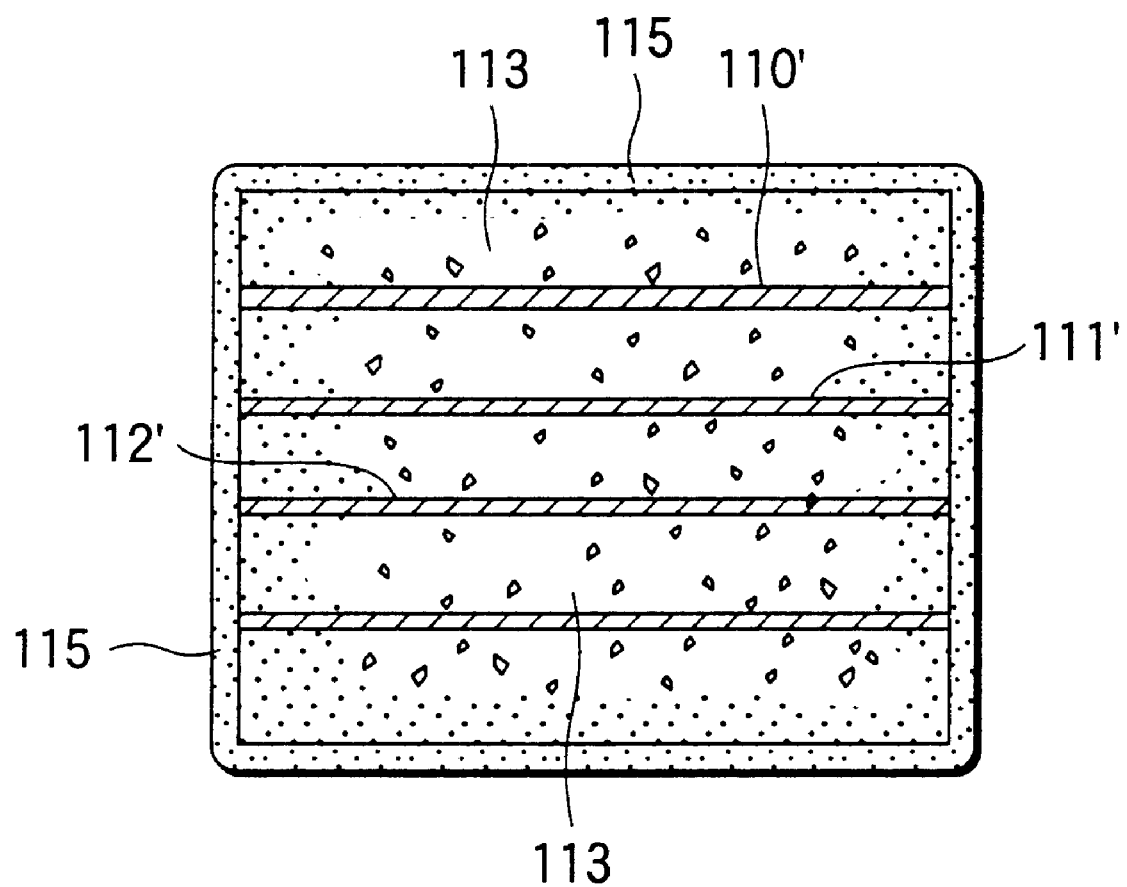
FIG. 4 is a cross sectional view showing the electronic parts of the multilayer piezoelectric ceramic according to those of FIG. 3.

Other than those not exposing the internal electrodes as shown in FIGS. 1 and 2, the electronic parts of the multilayer piezoelectric ceramic may be composed with the sintered piezoelectric ceramic where the internal electrodes 110', 111', 112' are printed all over except parts to both edges in length of the piezoelectric ceramic green sheets 113 as shown in FIG. 3, and the internal electrodes 110', 111', 112' are exposed at the edges as shown in FIG. 4.

The electric parts of the multilayer piezoelectric ceramics are produced by at first adding an organic binder of a predetermined amount as a main component of calcined powders of the piezoelectric ceramic, further adding solvent, fully mixing in a ball mill, and making slurry of the piezoelectric ceramics, and subsequently forming a thin film from the slurry on polyester film by a roll coater, heating to dry the thin film up to 80 to 100° C. on the polyester film, and punching it out to produce the green sheet of 20 μm thickness.

For forming the internal electrodes, Ag powders, Pd powders and ethyl cellulose are solved in butyl carbitol and terpineol, and agitated to mix to produce the electrically conductive paste. This electrically conductive paste is used to print on one side of the piezoelectric ceramic green sheets by the screen having desired patterns and dried to form the internal electrodes.

Next, a plurality of piezoelectric ceramic green sheets and internal electrodes are alternately stacked, and 20 sheets of the ceramic green sheets not printed with the internal electrodes (sheet thickness: 15 μm) are stacked on the upper and lower outermost layers. Subsequently, the stacked piezoelectric ceramic is being heated at about 60° C. while pressure is given to the stacking direction for pressure bonding.

The stacked piezoelectric ceramic is inserted in a furnace to burn out the organic binder and fired for two hours as holding the heating temperature at 1060° C., brought down to 600° C. at a rate of 200° C./hour, and cooled to room temperature to produce the sintered piezoelectric ceramics. Through this procedure, the organic binder is burned out, and the pores are dotted in the layers of the sintered piezoelectric ceramic.

For forming the film of the sintered piezoelectric ceramic, powders of any two or more components of ceramic compounds (called as "the same materials as element" hereafter) selected from elements composing all or a part of lead oxide (PbO), silicon oxide ($SiO_2$), aluminum oxide ($Al_2O_3$) and the sintered piezoelectric ceramic, are dispersed by synthetic resins such as ethyl cellulose or acrylic resin and solvent of methyl ethyl ketone (MEK), thereby to produce the glass insulating paste adjusted to be moderate viscosity.

The glass insulating paste is uniformly coated and dried on the surfaces of the sintered piezoelectric ceramic by such as a dip or spin coat, and heat-treated in the furnace of an air atmosphere at temperature of about 800° C. for 20 minutes. Through this procedure, the surfaces of the sintered piezoelectric ceramic can be formed with the film of the glass insulating material, and a glass content penetrates the layer of the sintered piezoelectric ceramic and diffuses to fill the pores.

The sintered piezoelectric ceramic is thereafter subjected to a dicing process to produce a piezoelectric ceramic chip, and finally the piezoelectric ceramic chip exposing the internal electrodes is coated at the edges thereof with the electrically conductive paste composed of Ag powders, Pd powders, glass frits and vehicle, and after drying the paste, the interior of the furnace is made the air atmosphere for baking at about 720° C. for 20 minutes so as to form the terminal electrodes.

In those structures not exposing the internal electrodes at the sides thereof, with respect to 100 pieces of the inventive products and the conventional products which have the film of the glass insulating material from composition of PbO: 30 wt %, SiO: 10 wt %, $Al_2O_3$: 10 wt %, the same materials as the element: 50 wt %, the comparison was evaluated by the high temperature high humidity test (test conditions: temperature: 85° C., relative humidity: 85% RH). The results are shown in Table 1.

TABLE 1

| | Reference No. | Thickness of film (μm) | Displacement | 10 h | 24 h | 50 h | 100 h | 250 h | 500 h | 1000 h |
|---|---|---|---|---|---|---|---|---|---|---|
| Percentage of Defects in Electric Parts of the Multilayer Piezoelectric Ceramic according to the Invention | 1 | 0.3 | ○ | 0 | 0 | 0 | 0 | 0 | 50 | 100 |
| | 2 | 0.5 | ○ | 0 | 0 | 0 | 0 | 0 | 0 | 0 |
| | 3 | 1 | ○ | 0 | 0 | 0 | 0 | 0 | 0 | 0 |
| | 4 | 3 | ○ | 0 | 0 | 0 | 0 | 0 | 0 | 0 |
| | 5 | 5 | ○ | 0 | 0 | 0 | 0 | 0 | 0 | 0 |
| | 6 | 7 | ○ | 0 | 0 | 0 | 0 | 0 | 0 | 0 |
| | 7 | 10 | X | 0 | 0 | 0 | 0 | 0 | 0 | 0 |
| Percentage of Defects in Electric Parts of the Multilayer Piezoelectric Ceramic according to the Conventional Products | 8 | — | X | 100 | | | | | | |

The inventive products can be composed enabling to prevent penetration of the moisture and reduce occurrence of defects in insulation and to have high reliability and durability by forming the film of the glass insulating material having thickness of 0.5 to 7.0 μm on the surface of the sintered piezoelectric ceramic. If the film thickness of the glass insulating material is around 0.3 μm, as it is thin, the durability is up to the high temperature and high humidity test for 1000 hours at the most. If the film thickness of the glass insulating material is about 10 μm, as it is thick, such a product is not desirable because of giving influences to the displacing characteristics of the sintered piezoelectric ceramic.

On the other hand, the external film of the organic resin of the conventional products cannot perfectly avoid invasion of the moisture, and such a product is only durable to the high temperature and high humidity test for 10 hours.

In those structures exposing the internal electrodes at the sides thereof, with respect to the inventive products and the conventional products which have the film of the glass insulating material from the same composition as above mentioned, the comparison was evaluated by the high temperature high humidity test (test conditions: temperature: 85° C., relative humidity: 85% RH). The results are shown in Table 2.

TABLE 2

| | Reference No. | Thickness of film (μm) | Displacement | 10 h | 24 h | 50 h | 100 h | 250 h | 500 h | 1000 h |
|---|---|---|---|---|---|---|---|---|---|---|
| Percentage of Defects in Electric Parts of the Multilayer Piezoelectric Ceramic according to the Invention | 9 | 0.3 | ○ | 100 | | | | | | |
| | 10 | 0.5 | ○ | 0 | 0 | 0 | 0 | 0 | 10 | 50 |
| | 11 | 1 | ○ | 0 | 0 | 0 | 0 | 0 | 0 | 0 |

TABLE 2-continued

| | Thickness of | | | Testing Time and Percentage of Accumulated Defects (%) | | | | | | |
|---|---|---|---|---|---|---|---|---|---|---|
| Reference No. | film (μm) | Displacement | 10 h | 24 h | 50 h | 100 h | 250 h | 500 h | 1000 h |
| 12 | 3 | ○ | 0 | 0 | 0 | 0 | 0 | 0 | 0 |
| 13 | 5 | ○ | 0 | 0 | 0 | 0 | 0 | 0 | 0 |
| 14 | 7 | ○ | 0 | 0 | 0 | 0 | 0 | 0 | 0 |
| 15 | 10 | X | 0 | 0 | 0 | 0 | 0 | 0 | 0 |
| Percentage of Defects in Electric Parts of the Multilayer Piezoelectric Ceramic according to the Conventional Products 16 | — | X | | | | | | | |

Though the inventive products are those exposing the internal electrodes at the sides, if applying the film of the glass insulating material having thickness of 0.5 to 7.0 μm to the sintered piezoelectric ceramic on the surfaces thereof, such structure is available enabling to avoid invasion of the moisture, reduce occurrence of defects in insulation and have the high reliability and high durability. If the film thickness of the glass insulating material is around 0.3 μm, durability is up to the high temperature and high humidity test for around 10 hours. If the film thickness of the glass insulating material is about 10 μm, as it is thick, similarly to the structures not exposing the internal electrodes, such a product is not desirable because of giving influences to the displacing characteristics of the sintered piezoelectric ceramic.

On the other hand, the external film of the organic resin of the conventional products cannot avoid invasion of the moisture, and such a product is only durable to the high temperature and high humidity test for 10 hours.

Figure 5:
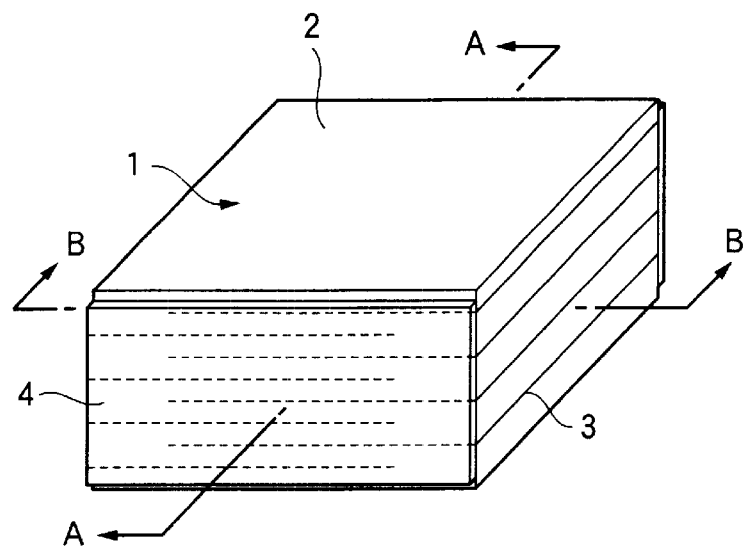
FIG. 5 is a schematically perspective view showing the structure of the multilayer piezoelectric element.
Figure 6A:
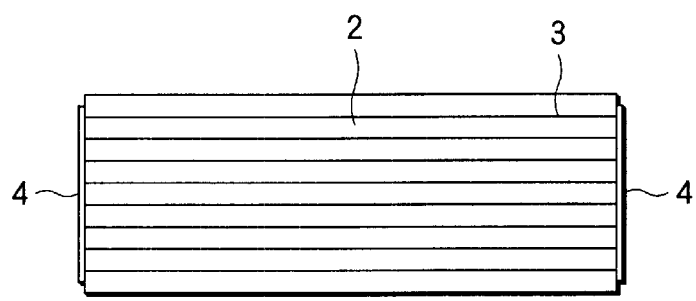
FIG. 6(a) is a cross sectional view along A—A line of FIG. 5.
Figure 6B:
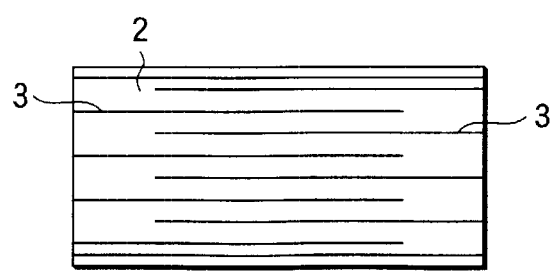
FIG. 6(b) is a cross sectional view along B—B line of FIG. 5.

Other embodiments of the invention will be specifically explained with reference to FIGS. 5 to 10(b2). FIG. 5 is a schematically perspective view showing the structure of the multilayer piezoelectric element 1 according to the invention, FIG. 6(a) is a cross sectional view along A—A line of FIG. 5, FIG. 6(b) is a cross sectional view along B—B line of FIG. 5. As shown in FIGS. 5, 6(a), and 6(b), the multilayer piezoelectric element 1 is composed of a piezoelectric ceramic layer 2, internal electrode layers 3 for impressing an electric field to the piezoelectric ceramic layer 2, glass insulating layers 4 for insulating the exposed edges of the internal electrode layers 3 and the piezoelectric ceramic layer 2 between the internal electrode layers 3, and terminal electrodes (not shown) for applying voltage to the internal electrode layers 3, and is structured such that the edges of the internal electrode layers 3 are exposed outside of the piezoelectric ceramic layer 2 every other layer.

Figure 8:
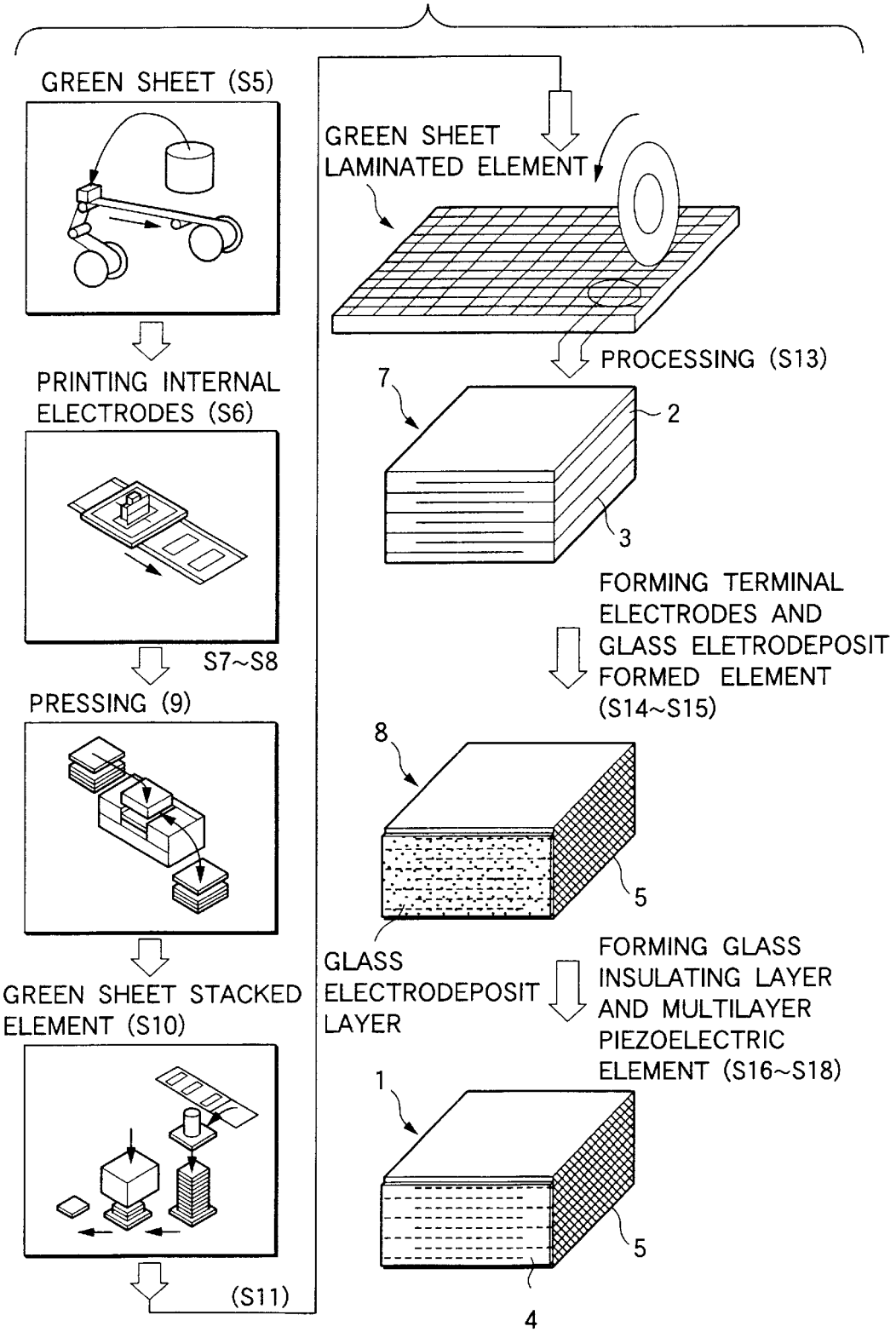
FIG. 8 is a schematic view showing element parts according to the invention.

FIG. 7 is a flow chart showing a procedure for making the multilayer piezoelectric element 1 according to the invention, and FIG. 8 is a schematic view showing element parts of FIG. 7. As shown in FIG. 7, raw materials for the piezoelectric ceramic are weighed and mixed (S1) in a water with $ZrO_2$ balls, dried and calcined (S2). Subsequently, this is grinded (S3) in the water with $ZrO_2$ balls, dried, and kneaded with organic solvent and resin ingredients so as to make paste (S4). The paste is thereafter coated on a polyester film and shaped into sheet thereby forming a green sheet (S5).

On the green sheet including the piezoelectric ceramic, conductive paste of main components being Ag and Pd is used to form the internal electrode layers 3 by such as a printing method (S6) into desired patterns, and process (S10) green sheets stacked with predetermined layers (S7 to S9). The stacked green sheets are subjected to burn-out organic binder (S11) and a firing (S12), and to a processing (S13) for forming a formed element 7 of a desired shape. The formed element 7 exposes the sides of the internal electrode layer 3 as shown in FIG. 8. The formed element 7 is provided with the terminal electrodes 5 (S14), and then predetermined glass particles are electrodeposited (S15) to the exposed sides of the internal electrode layers 3 by the electrophoretic deposition, dried (S16), heat-treated (S17) for making the multilayer piezoelectric element 1 (S18).

(Glass Insulating Layer)

The glass insulating layer 4 formed on the multilayer piezoelectric element 1 of the invention may be carried only on the exposed parts of the edges of the internal electrode layers 3 outside of the piezoelectric ceramic layers 2. Similarly, as shown in FIGS. 5, 6(a), and 6(b), it is preferable that the glass insulating layer 4 is carried on both of the exposed parts of the edges of the internal electrode layers 3 outside of the piezoelectric ceramic layers 2 and the surface of the piezoelectric ceramic layer between the internal electrode layers 3. The glass insulating layer 4 increases the moisture resistance of the multilayer piezoelectric element 1 and heighten the reliability. In addition, the glass insulating layer 4 enough lowly suppresses hindrance of displacement caused at driving the multilayer piezoelectric element 1.

(A Forming Method of the Glass Insulating Layer)

The method of forming such a glass insulating layer 4 requires the following items.

(A) The glass insulating layer 4 can be formed at least on the exposed parts of the internal electrode layer 3 outside of the piezoelectric ceramic layer 2.

(B) The glass insulating layer 4 can be formed uniformly in a predetermined thickness with good controllability and excellent precision in thickness.

(C) A speed of forming the glass insulating layer 4 is enough fast to an extent of not hampering productivity.

As the method of forming the glass insulating layer 4 satisfying such requirements, a method of combining the electrophoretic deposition and the heat treatment is taken up. Explanation will be made to the forming method of the glass insulating layer 4 using the electrophoretic deposition, referring to FIGS. 9, 10(a), 10(b1), and 10(b2).

(The Electrophoretic Deposition)

The electrophoretic deposition to be used in the invention is not especially limited, and a known method may be served. This electrophoretic deposition comprises, as exemplified in FIG. 9, at first immersing a formed element 7 provided with terminal electrodes 5 for the electrophoretic deposition at the exposed parts of the internal electrode layer 3 and an opposite electrode 6 in a suspension 11 dispersed with predetermined glass particles 10. The terminal electrodes 5 and the opposite electrode 6 are electrically connected. Subsequently a predetermined voltage is impressed from a power source provided between the opposite electrode 6 and the terminal electrodes 5. In such a manner, the glass particles 10 dispersed in the suspension 11 are moved toward the exposed parts of the internal electrode layer 3 along the electric field, so that it is possible to form a glass electrodeposit formed element 8 deposited selectively with the glass particles 10 on the exposed edges of the internal electrodes 3.

Subsequently, the glass electrodeposit formed element 8 is heat-treated in an air at a predetermined temperature so as to form uniform glass insulating layers 4. At this time, the heat-treating temperature is determined to be above the softening point of the glass particle 10 and below the firing temperature of the multilayer piezoelectric element in order to soften the glass particles 10 to be moderately fluidized, so that it is possible to form the uniform glass insulating layer 4 with suppressing defects enough. If then the heat treatment is carried out at a relatively low temperature as being above the fluidizing range of the softened glass particle 10 and for a relatively short time, it is possible as shown in, for example, FIG. 10(*b*1) to uniformly form the glass insulating layer 4 only in the vicinity of exposed part of the internal electrode layer 3.

Figure 10A:
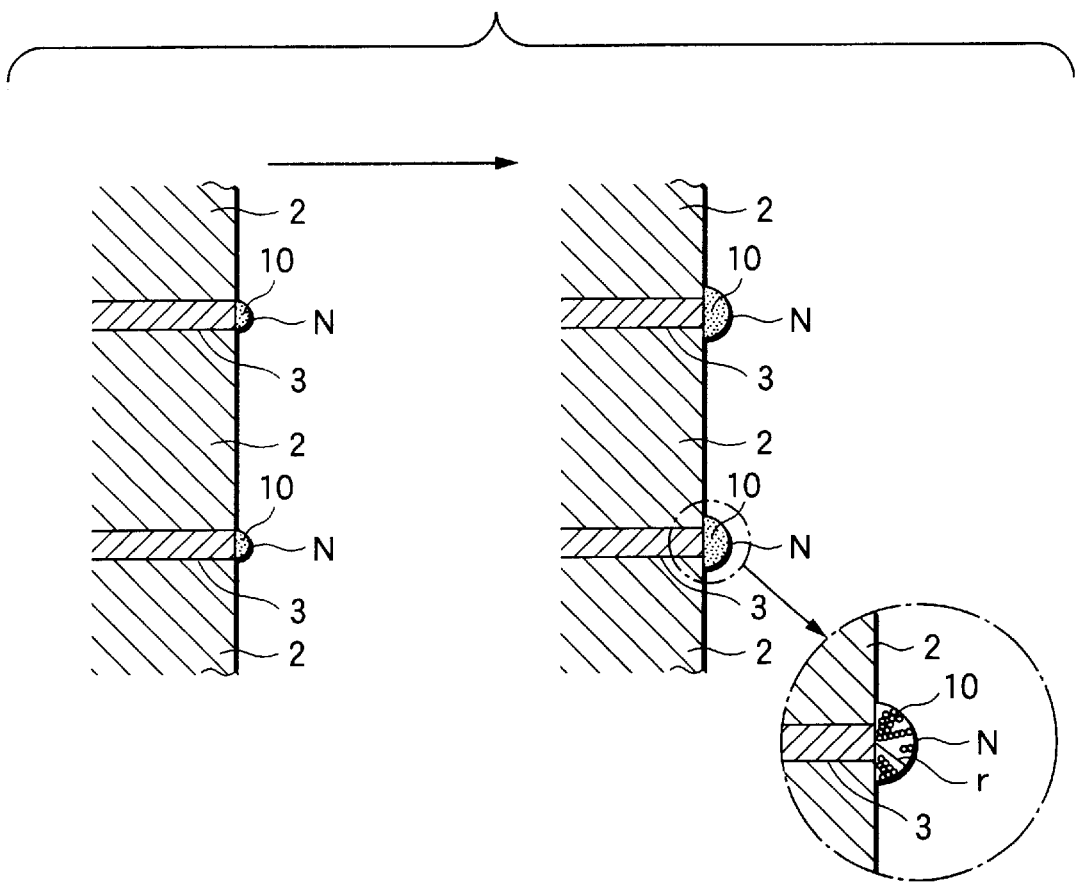
FIG. 10(a) is a view showing a process of the glass particles electrodeposited to the internal electrode layers by the electrophoretic deposition according to the invention.
Figure 10:
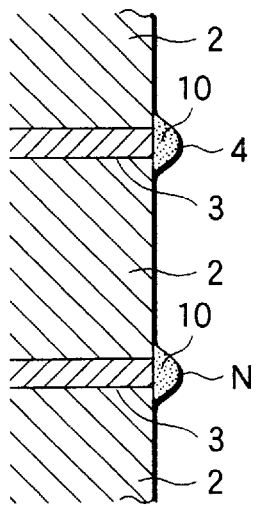
FIGS. 10(b1) and 10(b2) are schematic views showing the glass insulating layers formed by performing the heat treatment to the glass electrodeposited layers by the electrophoretic deposition of the invention.
Figure 10:
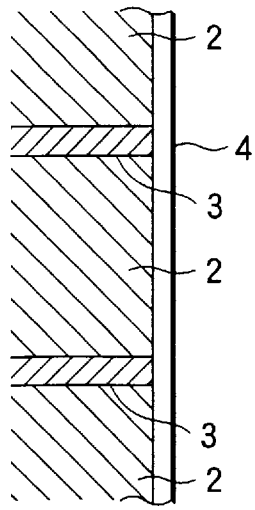
Figure 11:
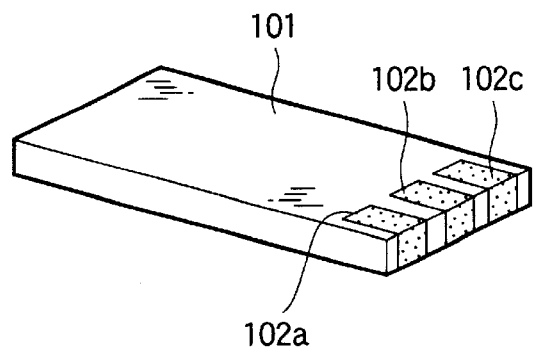
FIG. 11 is a perspective view showing the electronic parts of the multilayer piezoelectric ceramic not exposing the internal electrodes according to the conventional example.

On the other hand, if the heat-treating temperature is determined to be above the softening point of the glass particle 10 and the heat treatment is performed at the relatively high temperature as moderately expanding the fluidizing range of the softened glass particle 10 and for the relatively long time, it is possible as shown in, for example, FIG. 10(*b*2) to form the glass insulating layer 4 on both of the exposed part of the internal electrode layer 3 and the surface of the piezoelectric ceramic layer 2 between the internal electrode layers 3.

In case the glass insulating layer 4 is formed on both the internal electrode layer 3 and the piezoelectric ceramic layer 2 between the internal electrode layers 3, if fine pores exist in the surface of the piezoelectric ceramic layer 2, the softened glass particle 10 goes into and fills the pores, thereby enabling to prevent the moisture penetrating the interior of the multilayer piezoelectric element 1 from the surface of the piezoelectric ceramic layer 2.

The glass particle 10 is electrodeposited on the exposed part of the internal electrode layer 3 of the formed element 7 by the electrophoretic deposition, and the heat treatment is carried out at the temperature above the softening point of the glass particle 10 and below the firing temperature of the multilayer piezoelectric element, thereby enabling to form the glass insulating layer 4 on either of the only exposed part of the internal electrode layer 3 or on both of the exposed part of the internal electrode layer 3 and the piezoelectric ceramic layer 2 between the internal electrode layers 3. In such manners, as the glass insulating layer 4 can be formed in response to properties of the formed element 7 or requisite characteristics of the multilayer piezoelectric element 1, the characteristics and cost can be satisfied in preferable harmonies.

(The Electrodeposition of the Glass Particles by the Electrophoretic Deposition)

FIG. 10(*a*) schematically shows a process of the glass particles 10 being electrodeposited to the formed element 7 by the electrophoretic deposition, and FIGS. 10(*b*1) and 10(*b*2) schematically shows a process that the glass insulating layer is formed by performing the heat treatment to the glass electrodeposited layers as FIG. 10(*a*).

As shown in FIG. 10(*a*), in the electrophoretic deposition, the electrodeposited matter such as the glass particle 10 moves along the electric field from the opposite electrode to the terminal electrode, gets to the exposed part of the internal electrode layer 3, and forms an initial nucleus (not shown). Then, the initial nucleus grows to be a hemispherical land shaped layer N having, e.g., a radius r. It has been known that the radius r of this land shaped layer N gradually grows, contacts to combine a neighbor land shaped layer N, and at last forms a relatively flat layer (not shown).

A structure of the land shaped layer N formed by the electrophoretic deposition or a land shaped structure composed of a relatively flat layer are herein called as "glass electrodeposited layer".

According to the invention, as shown in FIG. 10(*a*), the formed element 7 is processed with the electrophoretic deposition and the glass electrodeposited layer is heat-treated at a predetermined temperature. With these processes, the glass insulating layer 4 of uniform thickness is efficiently formed with suppressing defects enough.

With such a heat treatment to the glass electrodeposited layer, glass particles are melted and uniform amorphous glass insulating layer 4 is formed. A shape of thus formed glass insulating layer 4 is formed as one of the following two types by appropriately setting temperature and time of the heat treatment. That is, by setting the heat-treating temperature to be relatively low, or setting the time to be relatively short, the glass electrodeposited layer 4 can be formed only in the vicinity of the exposed part of the internal electrode layer 4 as shown in FIG. 10(*b*1). On the other hand, by setting the heat-treating temperature to be relatively high, or setting the time to be relatively long, the glass electrodeposited layer 4 can be, as shown in FIG. 10(*b*2), formed on both of the exposed part of the internal electrode layer 3 and the piezoelectric ceramic layer 2 between the internal electrode layers 3. As having explained above, by appropriately setting the heat-treating conditions, the shapes of the glass insulating layers 4 can be adopted to qualities or characteristics required in the multilayer piezoelectric element 1.

In the invention, it is preferable that the glass electrodeposited layer 4 is formed on both of the piezoelectric ceramic surface of the upper face of the uppermost internal electrode layer 3 and the piezoelectric ceramic surface of the lower face of the lowermost internal electrode layer 3 or at least either one of them, other than the exposed parts of the internal electrode layers 3 and the surface of the piezoelectric ceramic layer 2 between the internal electrode layers 3.

(The Heat-Treating Temperature for Forming the Glass Insulating Layer)

The conditions of the heat-treating temperature for forming the glass insulating layer 4 according to the invention are ranges where the heat-treating temperature does not give bad influences to the piezoelectric ceramic layer 2 and the internal electrode layer 3, and to soften the electrodeposited glass particles and to form uniform layers. In case the piezoelectric ceramic layer 2 is composed of PZT {Pb(Zr, Ti)O$_3$} based ceramic materials, and the internal electrode layer 3 is composed of the above mentioned Ag—Pd alloy, it is preferable that the heat-treating temperature for forming the glass insulating layer 4 from the glass electrodeposited layer is 1000° C. or lower, which is lower than the firing temperature of the multilayer piezoelectric element.

(Thickness of the Glass Insulating Layer)

The conditions for the thickness of the glass insulating layer 4 are for the glass insulating layer 4 to sufficiently and lowly suppress hindrance of displacement when the multilayer piezoelectric element 1 is driven, and for the internal electrode layer 3 of the multilayer piezoelectric element 1 to insulate the exposed part from the outside and to impart sufficient moisture resistance. As the glass insulating layer 4 satisfying such conditions, the thickness is preferably 0.3 to 10 µm. Being less than 0.3 µm, the imparted moisture resistance is not enough, while being larger than 10 µm, the hindrance by displacement when driving the multilayer piezoelectric element 1 is excessive, and inconveniences will probably arise when it is served as a piezoelectric actuator.

Further, the thickness of the glass insulating layer 4 is more preferably 0.5 to 7 µm in view of more stably exhibiting the performance of the multilayer piezoelectric element 1 or dispersion in quality of products to be less.

(Chemical Composition of the Glass Insulating Layer)

With respect to the chemical composition of the glass insulating layer 4 of the multilayer piezoelectric element 1 according to the invention, it is necessary to perform the heat treatment at the temperature and for the time not giving bad influences to the internal electrode layer 3, and to form one with thickness not hindering the displacement when the multilayer piezoelectric element is driven.

As materials of composing the glass insulating layer 4 having the above mentioned preferable range of the heat-treating temperature and the moderately large elastic modulus, glass insulating materials such as PbO, $SiO_2$ or $Al_2O_3$ may be enumerated.

For approaching the elastic modulus of the glass insulating layer 4 to the elastic modulus of the multilayer piezoelectric element 1, it is preferable to add the piezoelectric ceramic into a glass matrix having the above mentioned glass component in a range not to obstructing the amorphous nature of the glass insulating layer 4.

The glass insulating layer 4 satisfying the above mentioned conditions is preferably composed of components as below.

(1) the glass component is based on a single component.

(2) the glass component is based on a mixed component including a plurality of components (3) the single component is dispersed with piezoelectric ceramic in the glass matrix thereof, and (4) the mixed component is dispersed with the piezoelectric ceramic in the glass matrix thereof.

In the above (3) and (4), if the piezoelectric ceramic is the same as the piezoelectric ceramic 2 of the multilayer piezoelectric element 1, the elastic modulus of the glass insulating layer 4 comes preferably nearer to the elastic modulus of the multilayer piezoelectric element 1.

In a case where the glass insulating layer 4 is composed of PbO: 10 to 80 wt %, $SiO_2$: 10 to 80 wt %, $Al_2O_3$: 0 to 50 wt % and the same piezoelectric ceramic as the piezoelectric ceramic of the multilayer piezoelectric element 1: 0 to 50 wt %, the multilayer piezoelectric element 1 will be one which enough lowly suppresses the hindrance of displacement when the multilayer piezoelectric element 1 is driven, heightens the moisture resistance, improves the reliability and the durability, and costs down relatively.

(The Internal Electrode Layer)

The internal electrode layer 3 of the multilayer piezoelectric element 1 of the invention generates displacement in the piezoelectric ceramic layer 2 by impressing a predetermined voltage, and drives the multilayer piezoelectric element 1. The internal electrode layer 3 is formed in film shape having a predetermined pattern on a green sheet comprising the piezoelectric ceramic, and the piezoelectric ceramic layers 2 and the internal electrode layers 3 are alternately stacked by stacking the green sheets to be an opposite electrode for exerting the electric field to the piezoelectric ceramic layer 2.

(Requirements of the Internal Electrode Layer)

As the requirements of the internal electrode layer 3, the following items will be enumerated.

(a) The layer can be easily formed at a predetermined position on the green sheet.

(b) The layer can be formed on the green sheet with a good adhesion.

(c) The layer can hold the function as the electrode after fired at a predetermined temperature.

(d) The layer can displace in response to the displacement of the piezoelectric ceramic layer 2 as holding a predetermined structure of the electrode.

As the internal electrode layer satisfying the above requirements (a) to (d), including economics, and fulfilling them as soon as possible at preferable harmonies, Ag—Pd alloy is generally used where Ag is based and Pd is added at an appropriate amount. The thus composed internal electrode layer 3 may be added with at least one kind of other metals than the paste Ag—Pd alloy, metallic oxides or organic metallic compounds. On a yet more outside of the internal electrode layer 3 positioned at the outermost position of the multilayer piezoelectric element 1, the piezoelectric ceramic layer 2 is formed.

(The Forming Method of the Internal Electrode Layer)

No limitation is especially made to the forming method of the internal electrode layer, and conventionally known methods may be used. For example, when forming the internal electrode layer with an electric conductive paste, it may depends on a so-called printing method of coating on the green sheet by means of a stamp, roller, screen or mask. Further, when forming the internal electrode layer 3 by a dry film forming method such as a spattering method or a vapor deposition method, at first a photo resist film is formed on the surface of the green sheet, and the photo resist film is formed in a predetermined pattern shape by a photo lithographic method including an exposure treatment using a predetermined mask, and then the internal electrode layer 3 may be formed with the dry film forming method. Otherwise it may be formed with a non-electrolysis plating method immersing the green sheet in an electrolytic solution containing a predetermined metal.

The multilayer piezoelectric element 1 according to the invention is provided with the terminal electrodes connected to predetermined positions of the edges of the internal electrode layers 3, the terminal electrodes being led to an external source via lead terminals (not shown).

The multilayer piezoelectric element 1 of the invention is not especially limited with respect to stacking number of the piezoelectric ceramic layers 2 and the internal electrode layers 3 (area, thickness, width), and such a multilayer piezoelectric element composed of at least two layers is sufficient.

Further, the multilayer piezoelectric element 1 of the invention is not especially limited with respect to shapes, and it is enough if the above structured glass insulating layer 4 is formable. For example, such a shape is permitted which is provided with holes in the interior of the multilayer piezoelectric element 1.

Besides, the multilayer piezoelectric element 1 of the invention is not especially limited with respect to displacing orientations when driving, and either piezoelectric effect is sufficient for a so-called piezoelectric vertical effect displacing in a vertical direction in in-place of each layer or a so-called piezoelectric lateral effect displacing in a horizontal direction in in-place of each layer.

EXAMPLES

Examples of the invention and Comparative examples will be explained referring to the attached drawings. FIG. 5 is a schematically perspective view showing the structure of the multilayer piezoelectric element 1 of the present example, FIG. 6(*a*) is a cross sectional view along A—A line of FIG. 5, and FIG. 6(*b*) is a cross sectional view along B—B line of FIG. 5. As shown in FIG. 5 and FIGS. 6(*a*) and 6(*b*), the multilayer piezoelectric element 1 comprises the piezoelectric ceramic layers 2, the internal electrode layers 3 for impressing the electric field to the piezoelectric ceramic layer 2, the glass insulating layers 4 for insulating the piezoelectric ceramic layers between the exposed edges of the internal electrode layers 3 and the internal electrode layers 3, and terminal electrodes (not shown) for supplying voltage to the internal electrode layers 3, and is structured such that the edge faces of the internal electrode layers 3 are exposed every other layer at the sides.

(Method of Producing the Multilayer Piezoelectric Element)

FIG. 7 is a flow chart showing a procedure for making the multilayer piezoelectric element 1 according to the invention, and FIG. 8 is a schematic view showing element parts of FIG. 7. In FIGS. 7 and 8, the piezoelectric ceramic powders, binder and organic solvent were mixed, and the paste was prepared (S1 to S4), and was shaped into the green sheet (S5). Separately, the electric conductive material, binder and organic solvent were kneaded to prepare the paste for the internal electrode layers.

Figure 9:
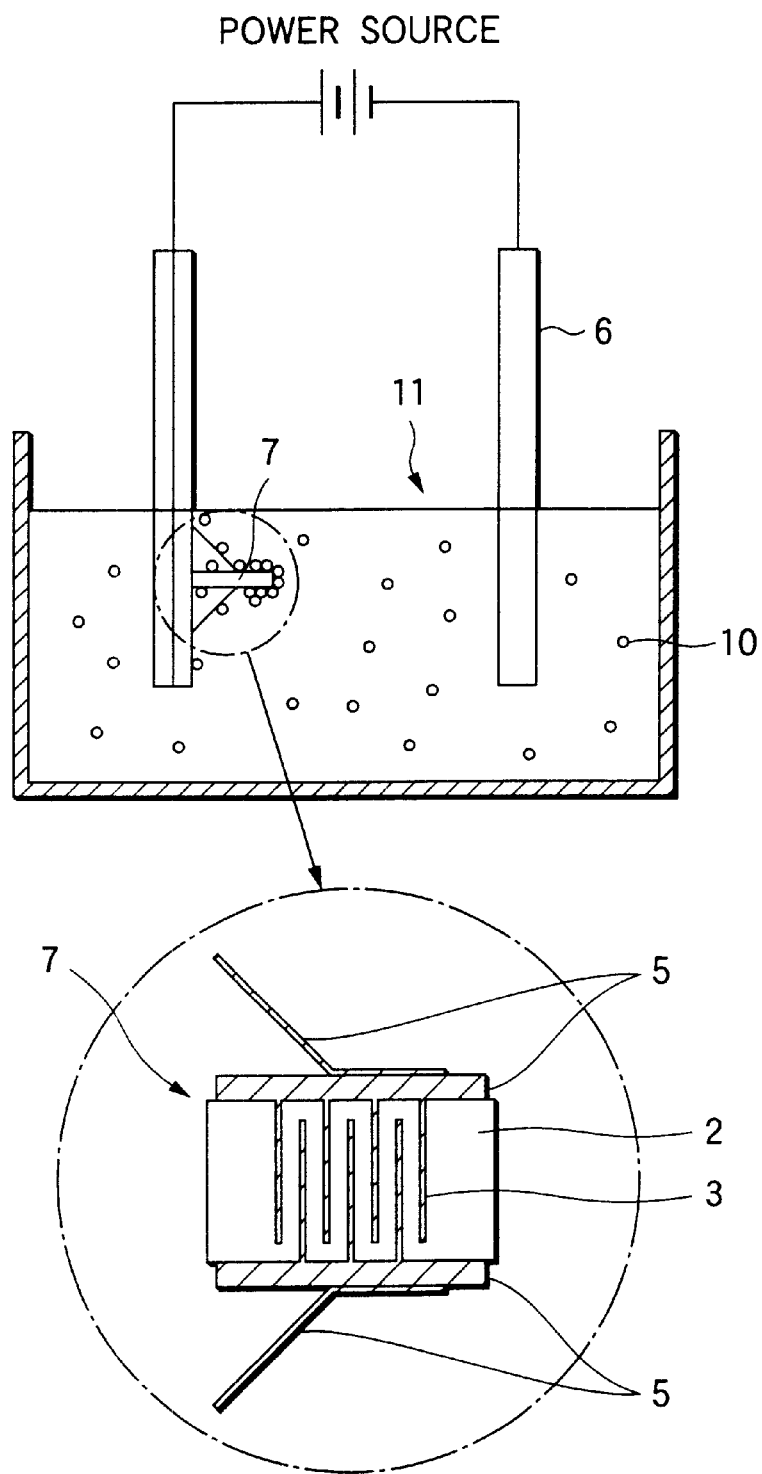
FIG. 9 is a schematic view showing one example of the electrophoretic deposition according to the invention.

On the green sheet, the paste for the internal electrode layers in a desired shape was printed (S6), then cut into a desired size (S7), stacked 30 sheets (S8), pressed (S9) so as to form the green sheet stacked element (S10), burned out organic binder (S11), a firing (S12), and to a processing (S13) for forming a formed element 7 of a desired shape exposing the sides of the internal electrode layer 3. The shaped element 7 was formed with the terminal electrodes 5 at the desired positions of the exposed parts of the internal electrode layers 3 (S14), and then processed by the electrophoretic deposition as shown in FIG. 9.

Namely, the multilayer piezoelectric element was immersed in the suspension 11 dispersed with the glass particles 10, and the terminal electrodes 5, the opposite electrode 6 and the power source were connected and impressed with voltage, whereby the glass particles 10 were moved along the electric field and electrodeposited to the exposed parts of the internal electrodes 3 and the vicinity thereof (S15), and the glass electrodeposit formed element 8 having the terminal electrodes 5 and the glass deposited layers were formed. The glass electrodeposit formed element 8 was thereafter dried (S16), heat-treated at the predetermined temperatures (S17) to form the glass insulating layers 4 and make test samples of the multilayer piezoelectric element 1 (S18).

In the electrophoretic deposition, the impressed voltage was given appropriate leveling for making test samples (S17 to S18) of the Examples (1 to 7) whose thickness of the glass insulating layer 4 was within the specified range of the invention, the Comparative example 8 without forming the glass insulating layer 4, and the Comparative example 9 where the thickness of the glass insulating layer 4 was out of the specified range of the invention.

With respect to each of the test samples, initial electric characteristics such as the insulating resistance and capacity were measured and evaluated (S19), while the reliability was evaluated by the moisture resisting test (S20) under high temperature and high humidity in order to accelerate the migration phenomena from the internal electrode layer 3, and accumulated defects rate at each testing time (10 to 1000 hours) was investigated.

For studying the dependency of the thickness of the glass insulating layer 4 upon the restraining rate of hindrance of the displacement which is a ratio of controlling hindrance of the displacement when driving the multilayer piezoelectric element 1, a polarization treatment was carried out on each of the test samples, and the displacement was measured by the eddy current typed displacement measuring apparatus. The construction of the test samples and the conditions of the moisture resisting tests are shown below. Table 3 shows the tested results.

(Construction of the Testing Samples)

Outward size:

5.0×5.0×3.0 mm

Piezoelectric ceramic layer:

Chemical composition;

$Pb_{0.96}Sr_{0.04}\{(Co_{1/3}Nb_{2/3})_{0.01}Ti_{0.46}Zr_{0.53}\}O_3+WO_3$

Thickness; 25 µm

Internal electrode layer:

Ag—Pd alloy (Ratio of the chemical composition; Ag/Pd=70 wt %/30 wt %)

Thickness; 2 µm

Number of stacked layers:

30 (1 layer is a combination of one piezoelectric ceramic layer and one internal electrode layer)

Terminal electrode:

Ag—Pd alloy (Conditions of Producing Test Samples)

Firing temperature of the green sheet:

1100° C.

(Conditions of the Electrophoretic Deposition)

Construction of the suspension:

Glass particles+dispersion medium (Dispersion medium:acetic anhydride)

Chemical composition of glass particles:

PbO; 60 wt %

$SiO_2$; 20 wt %

$Al_2O_3$; 20 wt %

Concentration of glass particles in the suspension; 1 wt %

Treating conditions:

Impressed voltage; D.C. 10 to 100 V

Treating time; 30 seconds

Treating temperature; 25° C.

Heat treating conditions of glass deposited layer; 800° C., 20 minutes (Test of Evaluating Reliability)

Conditions of the moisture resisting test:

Atmosphere of testing chamber; 85° C./85% RH

Impressed voltage when driving test samples; D.C. 50 V (2 kV/mm)

Evaluating reference of the reliability; Comparing with an initial value with respect to the insulating resistance, evaluations were performed in that defects was defined as a case where an order was lowered by three figures, and success was defined as a case where an order was lowered by two figures or less.

Displacement measuring conditions; The voltage of 50 V (2 kV/mm) was impressed at room temperature.

TABLE 3

Measurements of test samples and evaluated results

| Division | Number | Thickness of glass insulating layers (μm) | Amount of displacement (μm) | Controlling percentage of hampering displacement (%) | Percentage of accumulated defects with respect to high temperature and high humidity tests (%) | | | | | | |
|---|---|---|---|---|---|---|---|---|---|---|---|
| | | | | | 10 hours | 20 hours | 50 hours | 100 hours | 250 hours | 500 hours | 1000 hours |
| Examples | 1 | 0.3 | 0.81 | 95.3 | 0 | 0 | 0 | 0 | 0 | 60 | 100 |
| | 2 | 0.5 | 0.80 | 94.1 | 0 | 0 | 0 | 0 | 0 | 0 | 0 |
| | 3 | 1.0 | 0.80 | 94.1 | 0 | 0 | 0 | 0 | 0 | 0 | 0 |
| | 4 | 3.0 | 0.77 | 90.6 | 0 | 0 | 0 | 0 | 0 | 0 | 0 |
| | 5 | 5.0 | 0.74 | 87.1 | 0 | 0 | 0 | 0 | 0 | 0 | 0 |
| | 6 | 7.0 | 0.73 | 85.9 | 0 | 0 | 0 | 0 | 0 | 0 | 0 |
| | 7 | 10.0 | 0.68 | 80.0 | 0 | 0 | 0 | 0 | 0 | 0 | 0 |
| Comparative Examples | 8 | none | 0.85 | — | 60 | 80 | 100 | — | — | — | — |
| | 9 | 15.0 | 0.61 | 71.8 | 0 | 0 | 0 | 0 | 0 | 0 | 0 |

1) Displacement measuring method: Displacements in thickness were measured by the eddy current displacement measuring apparatus (DC 50 V(2 kV/mm))
2) In reference to the displacement of Comparative Example 8, percentage of displacement in each test sample was calculated.
(Results of measuring the displacement and evaluating the reliability test)

Table 3 shows, in the Examples (1 to 7) and the Comparative examples (8 and 9), thickness (μm) of each glass insulating layer 4, displacement (μm), controlling percentage of hampering displacement which expresses degree of controlling obstacle of displacement, and percentage of accumulated defects when the moisture resisting tests were carried out for 10 to 1000 hours. The controlling percentage is calculated by making the displacement (0.85 μm) of the Comparative example 8 as the standard (100%). Note that the Comparative example 8 is a bare multilayer piezoelectric element without forming the glass layer 4.

From Table 3, in the Comparative example 8 without forming the glass insulating layer 4, the accumulated defects is 60% after 10 hours and 100% after 50 hours, and the reliability is remarkably low. In the Comparative example 9 where the thickness of the glass insulating layer 4 is 15 μm, the accumulated defects after 1000 hours is 0%, and although the reliability is remarkably heightened, the controlling percentage of hampering displacement stands still 72% of the Comparative example 8, without forming the glass insulating layer 4, and the function of the displacement as the piezoelectric actuator is largely lowered.

On the other hand, in the Examples 1 to 7 where the thickness of the glass insulating layer 4 is 0.3 to 10 μm, the displacement is prevented from hampering as the controlling percentage of hampering displacement is 80 to 95%, and the accumulated defects is 60% after 500 hours in the Example 1 (thickness of the glass insulating layer 4: 0.3 μm), and 0% after 1000 hours in the Examples 2 to 7 (thickness of the glass insulating layer: 0.5 to 10 μm). Thus, the reliability and the durability are improved in leaps.

As seen in the results of the Examples (1 to 7) and the Comparative examples (8, 9), the multilayer piezoelectric element 1 of the invention can display a satisfied displacing function when driving by the formed glass insulating layer 4 which sufficiently controls obstacle of displacement, and while the reliability and the durability are enough secured even at high temperature and high humidity by the glass insulating layer 4, an expected performance can be exhibited to the full.

The invention is not limited to the Examples but various modifications are available as far as displaying the effects of the invention. In the composition of the piezoelectric element, as long as causing displacement, no limitation is made to only PZT based ceramic materials, and the piezoelectric element can be composed with discretionary modifications of PZT or with a composition without lead.

If a matter contains metallic components causing migration in the internal electrode, it is a suitable object of the invention. If a material can sufficiently secure the function also in the terminal electrode after heat treating the glass, it is satisfied, and the internal electrode may be composed of chemical compositions other than in the Example. The invention is not applied to only the actuator, and if applying the invention to those of relatively low impressed voltage such as multilayer piezoelectric transformers, the moisture resistance can be improved with the same structure and the reliability can be heightened.

As mentioned above, depending on the electronic parts of the multilayer piezoelectric ceramic according to the invention and the production method thereof, if the film of the glass insulating material having the predetermined thickness is provided to the sintered piezoelectric ceramic on the surfaces thereof, invasion of the moisture can be prevented, and it is possible to avoid defects in insulation between the internal electrodes caused by the invasion of the moisture and defects in insulation caused by migration, to work for a long time under the atmosphere at high temperature and high humidity, and to secure reliability and durability.

Further, by the above explained structure, the invention displays the following effects.

First, since the glass insulating layer is formed to only the exposed parts of the internal electrode layers, or both of the exposed parts of the internal electrode layers and the surface of the piezoelectric ceramic layers between the internal electrode layers, the moisture resistance is improved, and it is possible to offer the multilayer piezoelectric element having the excellent reliability and durability.

By combining the electrophoretic deposition and the heat treatment to be carried out at the predetermined temperature, the glass insulating layer can be precisely formed in uniform thickness also in the piezoelectric ceramic layer between the internal electrode layers, and if fine pores exist in the piezoelectric ceramic layer, since the glass layer can be penetrated also into the interiors of the pores, it is possible to offer the multilayer piezoelectric element preventing the moisture from going into the interior.

Second, since the thickness of the glass insulating layer is specified, in addition to the above mentioned effect, it is possible to exactly control defects of the glass insulating layer and hindrance of displacement of the multilayer piezoelectric element and to heighten the reliability and the durability of the multilayer piezoelectric element.

Third, the heat treatment at forming the glass insulating layer does not give bad influences to the internal electrode layer, and the heat treating temperature of the glass insulating layer is specified so that the glass insulating layer controls hindrance of displacement when driving the multilayer piezoelectric element, and the components of the glass insulating layer are prepared such that various needs of the multilayer piezoelectric element are satisfied. In addition to the above mentioned effects, the expected functions are fully displayed, and it is possible to offer the multilayer piezoelectric element more suited to needs.

Fourth, since the piezoelectric ceramic to be added to the glass insulating layer is composed with the same components as the piezoelectric ceramic of the multilayer piezoelectric element, the glass insulating layer can displace substantially in the same displacement of the multilayer piezoelectric element at driving it, and in addition to the above mentioned effects, it is possible to control hindrance of displacement of the multilayer piezoelectric element as soon as possible.

Fifth, since the glass insulating layer is composed of PbO, $SiO_2$, $Al_2O_3$ and the same piezoelectric ceramic as the multilayer piezoelectric element, and the respective contents are specified, it is possible to offer the multilayer piezoelectric element satisfying the above mentioned effects and costs at desirable harmonies.

Sixth, it is possible to offer the piezoelectric actuator having the above mentioned effects.

Seventh, since it is possible to obtain such multilayer piezoelectric element improving the reliability, function, cost, precision and durability, the application of the multilayer piezoelectric element can be broadened.

What is claimed is:

1. An electronic part comprising:
    a main part including a sintered piezoelectric ceramic element having a first elastic modulus, the sintered piezoelectric ceramic element comprising a plurality of alternately stacked internal electrode layers and piezoelectric layers;
    a terminal electrode provided at an edge of the sintered piezoelectric ceramic element, electrically connecting at least one of the plurality of internal electrode layers; and
    a film having a second elastic modulus provided on surfaces of the sintered piezoelectric ceramic element, comprising a glass insulating material,
    wherein the first and second elastic moduli are substantially the same.

2. The electronic part according to claim 1, wherein said film comprises at least two components of ceramic compounds selected from the group consisting of lead oxide, silicon oxide, aluminum oxide, and all or a part of compounds consisting a piezoelectric ceramic.

3. The electronic part according to claim 1, wherein said film is 0.5 to 7.0 μm in thickness.

4. A multilayer piezoelectric element comprising:
    a structure comprising,
    a plurality of piezoelectric ceramic layers having a first elastic modulus, and
    a plurality of internal electrode layers, wherein the plurality of internal electrode layers and piezoelectric layers are alternately stacked so that edges of the plurality of internal electrode layers are exposed; and
    a glass insulating portion having a second elastic modulus deposited on the exposed edges of at least one of the plurality of internal electrode layers,
    wherein said glass insulating portion comprises a glass insulating layer having particles including a glass insulating material, and
    the elastic moduli of the plurality of piezoelectric ceramic layers and the glass insulating layer are substantially the same.

5. The multilayer piezoelectric element according to claim 4, wherein the glass insulating layer is uniformly formed on the exposed edges of the internal electrode layers and surfaces of piezoelectric ceramic layers.

6. The multilayer piezoelectric element according to claim 4, wherein the glass insulating layer of said glass insulating portion is deposited by an electrophoretic deposition and heat treatment.

7. The multilayer piezoelectric element according to claim 4, wherein the glass insulating layer is 0.3 to 10 μm in thickness.

8. The multilayer piezoelectric element according to claim 6, wherein a heat-treating temperature for forming the glass insulating layer is lower than a firing temperature of the multilayer piezoelectric element, and the glass insulating layer includes a glass component comprising one of:
    a single component;
    a component including a plurality of components;
    a single component dispersed with piezoelectric ceramic in a glass matrix thereof; and
    a mixed component dispersed with piezoelectric ceramic in a glass matrix thereof.

9. The multilayer piezoelectric element according to claim 8, wherein the piezoelectric ceramic contained in the glass insulating layer is the piezoelectric ceramic layer.

10. The multilayer piezoelectric element according to claim 4, wherein the glass insulating layer comprises:
    PbO between 10 to 80 wt %;
    $SiO_2$ between 10 to 80 wt %;
    $Al_2O_3$ between 0 to 50 wt %; and
    the piezoelectric ceramic layer between 0 to 50 wt %.

11. The multilayer piezoelectric element according to claim 4, wherein the multilayer piezoelectric element is configured as a piezoelectric actuator.

* * * * *